(12) United States Patent
Tiwari et al.

(10) Patent No.: US 7,082,034 B2
(45) Date of Patent: Jul. 25, 2006

(54) CIRCUIT COOLING

(75) Inventors: Nachiketa Tiwari, Framingham, MA (US); Bradford Kyle Subat, Worcester, MA (US); Benjamin G. Powers, Boston, MA (US)

(73) Assignee: Bose Corporation, Framingham, MA (US)

( * ) Notice: Subject to any disclaimer, the term of this patent is extended or adjusted under 35 U.S.C. 154(b) by 293 days.

(21) Appl. No.: 10/817,081

(22) Filed: Apr. 1, 2004

(65) Prior Publication Data

US 2005/0219822 A1   Oct. 6, 2005

(51) Int. Cl.
*H05K 7/20* (2006.01)
*F28F 7/00* (2006.01)
*H01L 23/34* (2006.01)

(52) U.S. Cl. ............... 361/719; 165/80.3; 165/185; 257/718

(58) Field of Classification Search ........ 361/688–690, 361/704, 712–715, 719–721; 174/16.1, 16.3; 165/185; 257/712, 713, 718, 719, 726
See application file for complete search history.

(56) References Cited

U.S. PATENT DOCUMENTS

| | | | |
|---|---|---|---|
| 5,065,279 A * | 11/1991 | Lazenby et al. ............ 361/720 |
| 5,274,193 A | 12/1993 | Bailey et al. |
| 5,712,765 A * | 1/1998 | Lehrmann et al. .......... 361/704 |
| 5,965,937 A * | 10/1999 | Chiu et al. .................. 257/716 |
| 6,025,991 A * | 2/2000 | Saito .......................... 361/704 |
| 6,034,874 A * | 3/2000 | Watanabe .................... 361/704 |
| 6,081,424 A | 6/2000 | Mach et al. |
| 6,266,244 B1 | 7/2001 | Guthrie |
| 6,317,325 B1 * | 11/2001 | Patel et al. ................. 361/704 |
| 6,618,252 B1 * | 9/2003 | Choi .......................... 361/719 |
| 6,646,880 B1 | 11/2003 | Liu |
| 6,667,884 B1 | 12/2003 | Lee et al. |
| 2003/0090875 A1 * | 5/2003 | Fitzgerald et al. .......... 361/708 |
| 2003/0150605 A1 * | 8/2003 | Belady et al. .............. 165/185 |
| 2003/0174469 A1 * | 9/2003 | Morelock .................... 361/719 |

* cited by examiner

*Primary Examiner*—Lynn Feild
*Assistant Examiner*—Corey Broussard
(74) *Attorney, Agent, or Firm*—Fish & Richardson P.C.

(57) ABSTRACT

A housing cover to cause electrical components to engage with at least one component pad of a heat sink, the cover including a projection integrally formed from the housing cover and positioned on the cover for biasing the electrical component against the component pad, and a mechanism that permits a vertical displacement of the projection relative to the vertical displacement of the housing cover. In one example, a slot extends around at least part of the projection so as to substantially decouple a vertical displacement of the projection from a vertical displacement of the housing cover.

25 Claims, 6 Drawing Sheets

CIRCUIT COOLING

BACKGROUND

This description relates to methods and apparatus for dissipating heat from electrical components located within a housing.

In amplifiers and other electrical devices, various electrical components contained within the device housing generate heat while operating and require cooling for proper operation. In one example, the electrical components are integrated circuits mounted to a circuit board which are cooled by dissipating heat generated to the ambient surroundings. Improved heat transfer and cooling of the electrical components is accomplished by positioning the electrical components proximate to a heat sink. Heat sinks are generally large metallic structures made from a highly heat conductive material, such as aluminum, for example, and include an expansive surface area formed by a number of fins for improved convective heat transfer to the ambient surrounding. The heat sink itself can form the chassis for the electrical device, housing a circuit board populated with electrical components, for example. In particular, amplifiers designed for vehicle audio systems have unique cooling requirements given the typical physical limitations for mounting the amplifier in the vehicle and the relatively high power levels and number of audio channels.

As shown in FIG. 1, an amplifier 20 includes a heat sink 25 which forms a chassis for supporting the electrical components of the amplifier. The heat sink has cooling fins 30 which extend from at least one surface of the heat sink and a substantially planar housing cover 35. As shown in FIG. 2, with the cover removed from the heat sink, a circuit board 40 includes one or more electrical components. Referring to FIGS. 3A and 3B, the circuit board supports electrical components 45a, 45b, 45c and 45d (collectively 45), which may be integrated circuits, for example. The reverse side of the circuit board is shown in FIG. 3B, with the corresponding locations of the electrical components 45 shown in phantom. The circuit board is disposed in the heat sink such that the electrical components are in substantial contact with component pads 50a, 50b (FIG. 5). The component pads extend from the heat sink toward the electrical components to provide a conductive thermal pathway for heat dissipation to the ambient surroundings.

Referring to FIG. 4, housing cover 35 is secured to the heat sink with fasteners extending through screw holes 55 and includes projections 60a, 60b, 60c and 60d (collectively, 60) and can include a number of ventilation holes 70. The location of the projections correspond to the location of the electrical components 45 on the circuit board, such that when the housing cover is fastened to the heat sink, the projections 60 engage the electrical components between the component pads 50 and the circuit board. In so doing, resistance to heat transfer from the components to the heat sink is reduced, and the heat generated in the electrical components is more effectively transferred to the heat sink.

With reference to FIG. 5, two adjacent component pads 50a, 50b can have different heights, as can the associated projections 60a, 60b, when accounting for stack-up tolerances. When the electrical components 45a, 45b are adjacent to one another, the associated projections are located adjacent one another. Given the close proximity of projection 60a to 60b (and similarly, 60c to 60d), vertical movement of projection 60a is strongly coupled to the movement of projection 60b. Accordingly, if projection 60a presses the electrical component 45a against component pad 50a, projection 60b will be limited by projection 60a, as both proximally extend from the same substantially rigid cover. The disparities in height noted above can lead to a gap 63 between electrical component 45b and projection 60b that interrupt or diminish proper cooling of the electrical components.

Attempts to reduce or bridge this gap and improve the cooling of the electrical components include the use of intermediate elements between the electrical component and the component pads such as clips, springs, gels, putty, or foam, for example. Such measures add additional components and cost to the manufacturing and assembly process and may not always maintain sufficient contact between the electrical component and the component pad, which may lead to overheating and failure of the electrical components.

SUMMARY

In general, in one aspect, the invention features an apparatus including a housing cover to cause electrical components on a circuit board to engage with at least one component pad of a heat sink, the housing cover being substantially coextensive with the circuit board, a projection integrally formed from the housing cover, the projection located on the cover to bias the electrical component against the component pad, and a mechanism that permits a vertical displacement of the projection relative to the vertical displacement of the housing cover.

Implementations of the inventions according to this aspect may include one or more of the following features. The mechanism can include a slot extending around at least part of the projection so as to substantially decouple a vertical displacement of the projection from a vertical displacement of the housing cover. The mechanism can also include a cantilevered tab extending from a perimeter of the housing cover. The apparatus can include two or more projections, and in one example, the projections are located proximate each other. The projections can be configured to deflect independently. The apparatus can also include a spanning element extending along the projections to substantially limit the upward vertical displacement of the projections. The spanning element can be integrally formed with the housing cover or, in another example, the attached to the housing cover by riveting, welding, bonding, or any combination thereof.

The apparatus can include a spanning lever attached to the first projection and the second projection and to an intermediate pivot positioned between the first and second projections. The spanning lever can bias the second projection against the direction of the displacement of the first projection. In one example, a positive vertical displacement of the first projection causes a proportional negative vertical displacement of the second projection. The spanning lever can be integrally formed with the housing cover or attached to the housing cover by riveting, welding, bonding, or any combination thereof. In one example, the housing cover is substantially planar. The heat sink can be configured for an audio amplifier, and in one example, an audio amplifier for a vehicle sound system.

In general, in another aspect, the invention features an apparatus including a housing cover to cause electrical components to engage with at least one component pad extending from a heat sink as well as first and second projections integrally formed from the housing cover and located on the cover to bias the electrical component against at least one component pad. The apparatus also includes a mechanism that permits a vertical displacement of the projection relative to the vertical displacement of the housing cover and a spanning element lever that biases the second projection against the direction of the displacement motion of the first projection. In one example, the housing cover and heat sink are adapted for the specific requirements of an audio amplifier in a vehicle sound system.

In general, in another aspect, the invention features an audio amplifier configured for use in a vehicle, the amplifier including a heat sink chassis containing a circuit board and configured for dissipating heat from electrical components positioned on the circuit board to ambient surroundings, a housing cover fitted to the chassis to cause electrical components positioned on a first side of the circuit board to engage with at least one component pad extending from the heat sink chassis, a projection integrally formed from the housing cover, the projection located on the cover to bias a second side of the circuit board opposite the first side, to cause electrical component to engage the component pad, and a mechanism that permits a vertical displacement of the projection relative to the vertical displacement of the housing cover.

In general, in another aspect, the invention features a housing cover for a heat sink including a number of projections integrally formed from the cover, the projections located on the cover to cause integrated circuits to engage component pads extending from the heat sink, at least two of the projections being proximate each other and comprising a cantilevered tab extending from a perimeter of the housing cover and configured to deflect substantially independently, a slot extending around at least part of the projection so as to substantially decouple a vertical displacement of the projections from a vertical displacement of the housing cover; and a spanning element extending along at least one projection to substantially limit the upward deflection of the projections.

In general, in another aspect, the invention features a housing cover for a heat sink including first and second cantilevered projections integrally formed from the cover and located at positions on the cover for biasing integrated circuits against at least one component pad extending from the heat sink, a slot extending around at least part of the projections so as to substantially decouple a vertical displacement of the projections from a vertical displacement of the housing cover, and a spanning lever attached to the first projection and the second projection and to an intermediate pivot located between the first and second projections such that a positive vertical displacement of the first projection causes a proportional negative vertical displacement of the second projection.

In general, in another aspect, the invention features a method of manufacturing a housing cover for an amplifier including integrally forming the cover from a unitary workpiece, where the cover has a projection integrally formed from the housing cover and located on the cover to bias the electrical component against the component pad and a mechanism that permits a vertical displacement of the projection relative to the vertical displacement of the housing cover.

Implementations of the inventions according to this aspect may include one or more of the following features. The mechanism can be formed to include a slot extending around at least part of the projection so as to substantially decouple a vertical displacement of the projection from a vertical displacement of the housing cover. The can be formed with a first and second projection proximate each other. The cover can also be formed with a spanning element extending along the projections to substantially limit the upward vertical displacement of the projections. In another example, the cover can be formed with a spanning lever attached to the first projection and the second projection and to an intermediate pivot located between the first and second projections.

In general, in another aspect, the invention features a method for engaging electrical components on a circuit board of an audio amplifier with a portion of a heat sink by providing a unitary housing cover that is substantially coextensive with the circuit board to permit a vertical displacement of integrally formed projections relative to a vertical displacement of the housing cover, applying the cover to the amplifier housing, engaging a first electrical component with the component pad by biasing an area on a second side of the circuit board, opposite the first side of the circuit board, and engaging a second electrical component with the component pad by biasing an area on the second side of the circuit board, opposite the position of the second electrical component.

Other advantages and features will become apparent from the following description and from the claims.

DESCRIPTION

Figure 1:
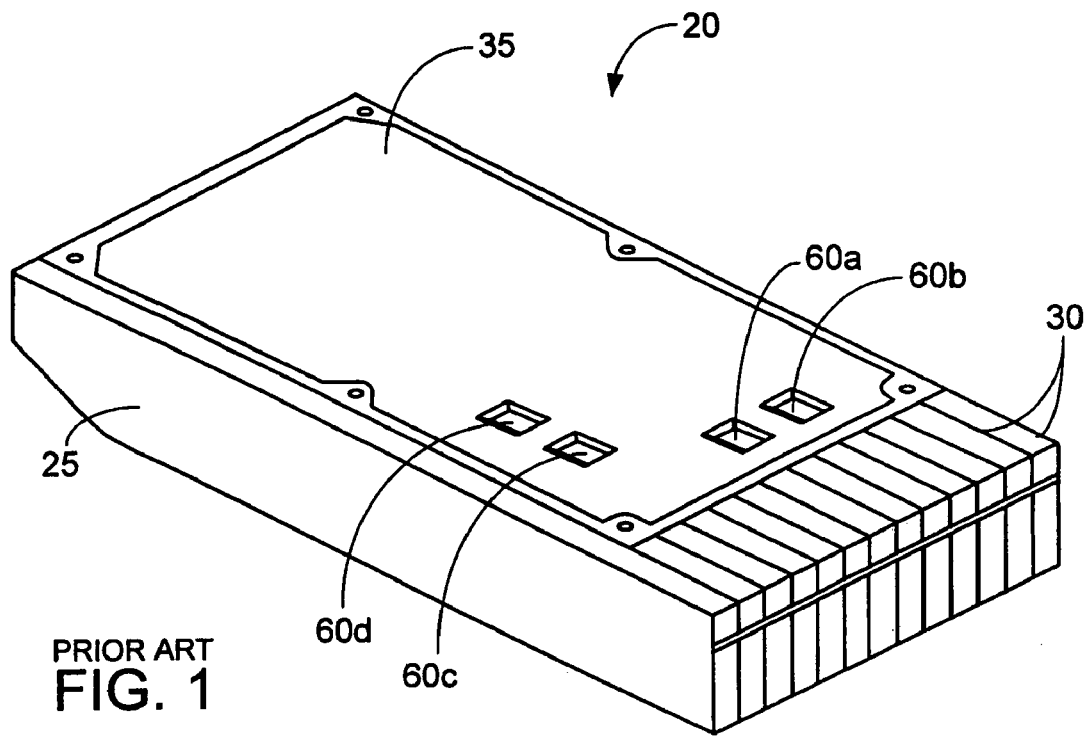
FIG. 1 is a perspective view of an amplifier, showing the heat sink and housing.
Figure 2:
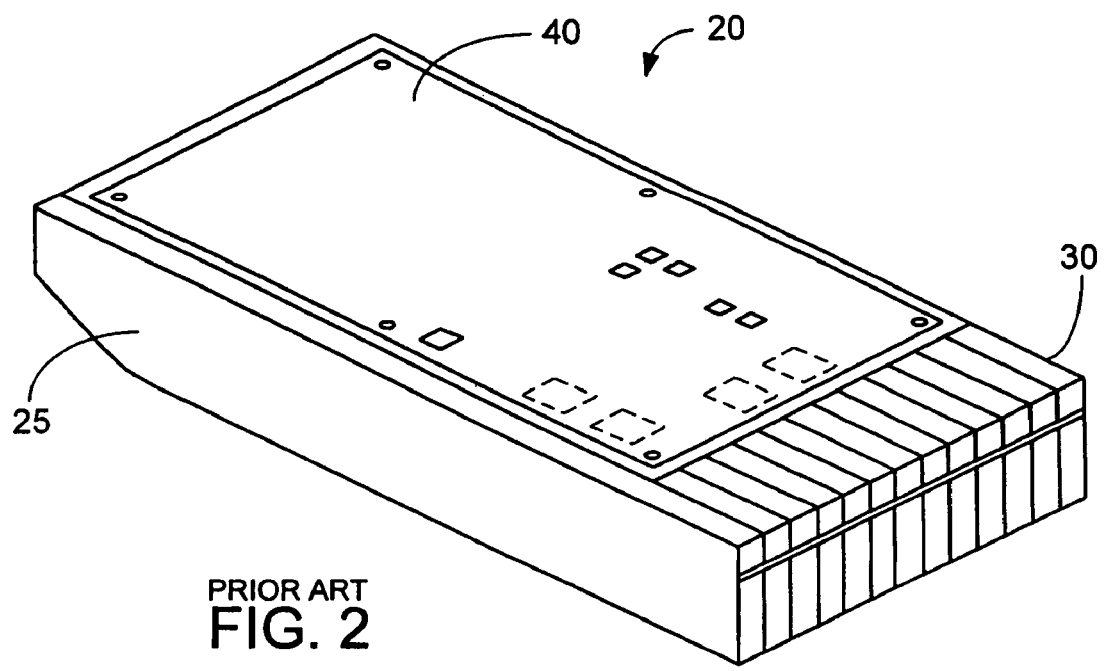
FIG. 2 is a perspective view of an amplifier with the housing cover removed revealing a circuit board populated with electrical components.
Figure 3A:
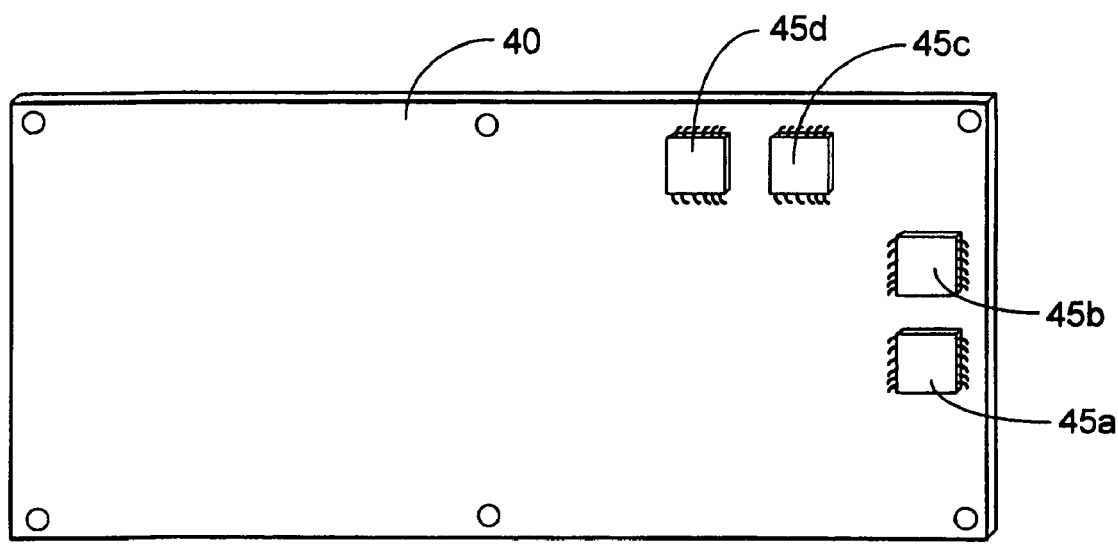
FIGS. 3A and 3B are plan views of the circuit board of the amplifier of FIG. 2.
Figure 3B:
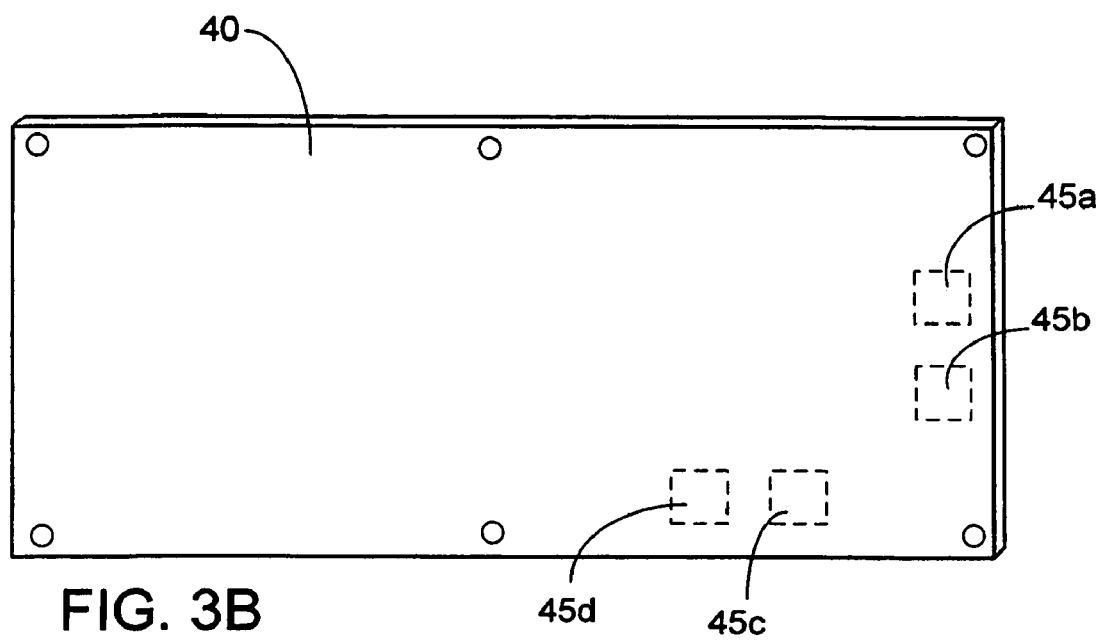
Figure 4:
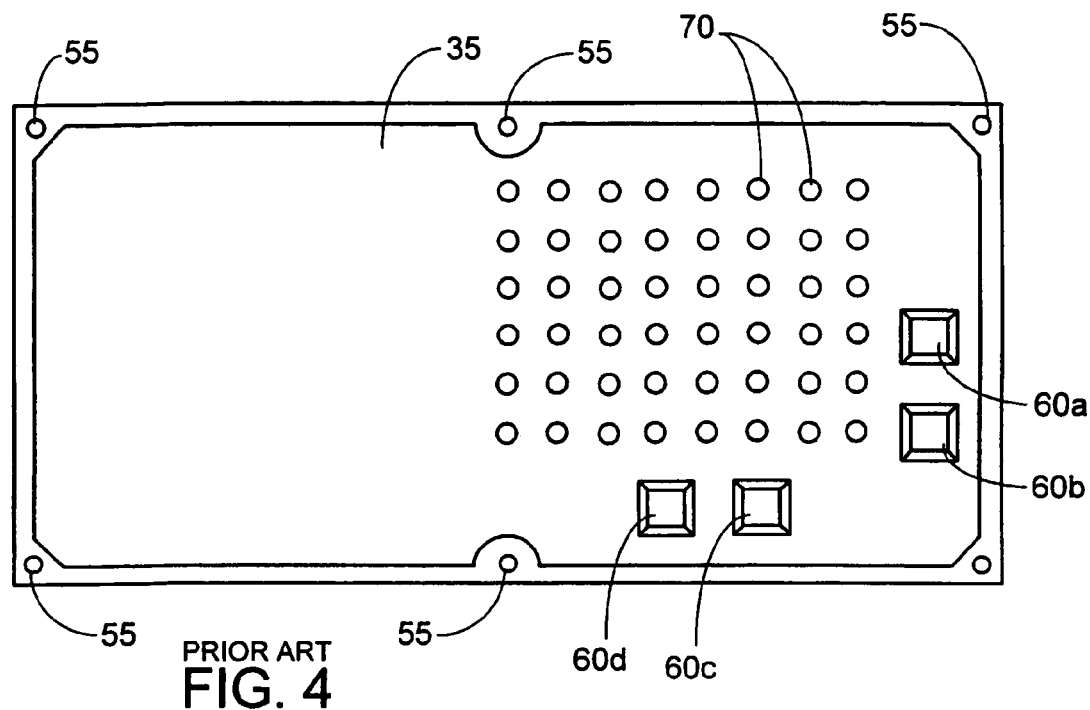
FIG. 4 is a plan view of a housing cover having projection for engaging portions of the circuit board of FIGS. 3A and 3B.
Figure 6:
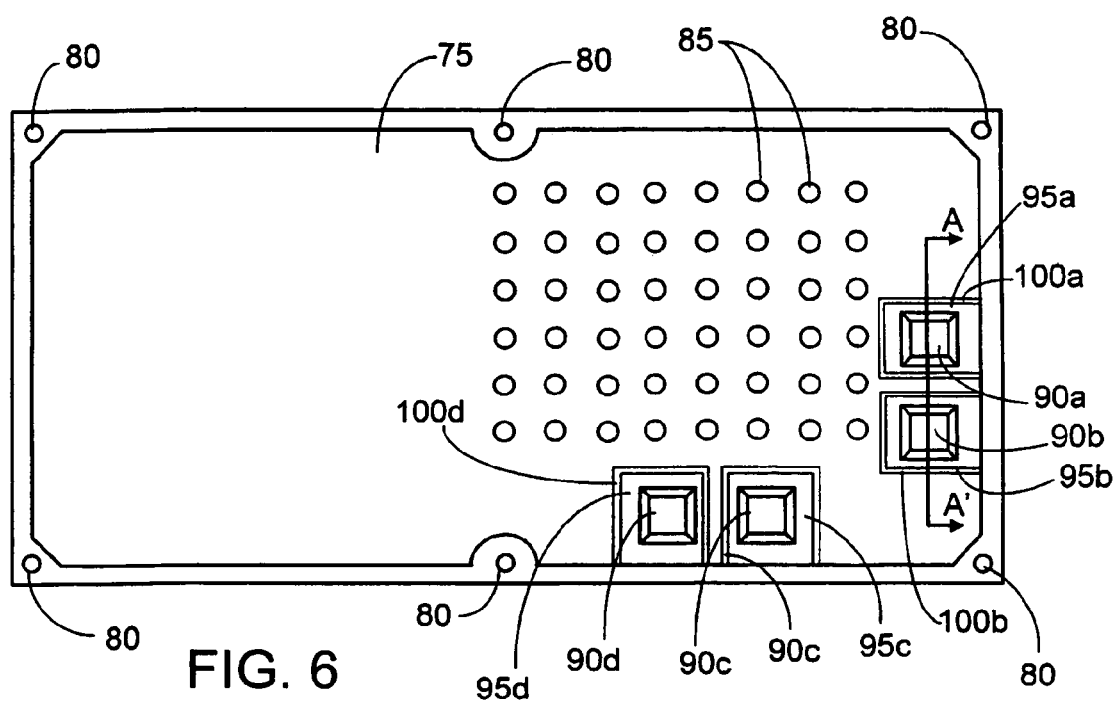
FIG. 6 is a plan view of a housing cover including a number of projections.
Figure 5:
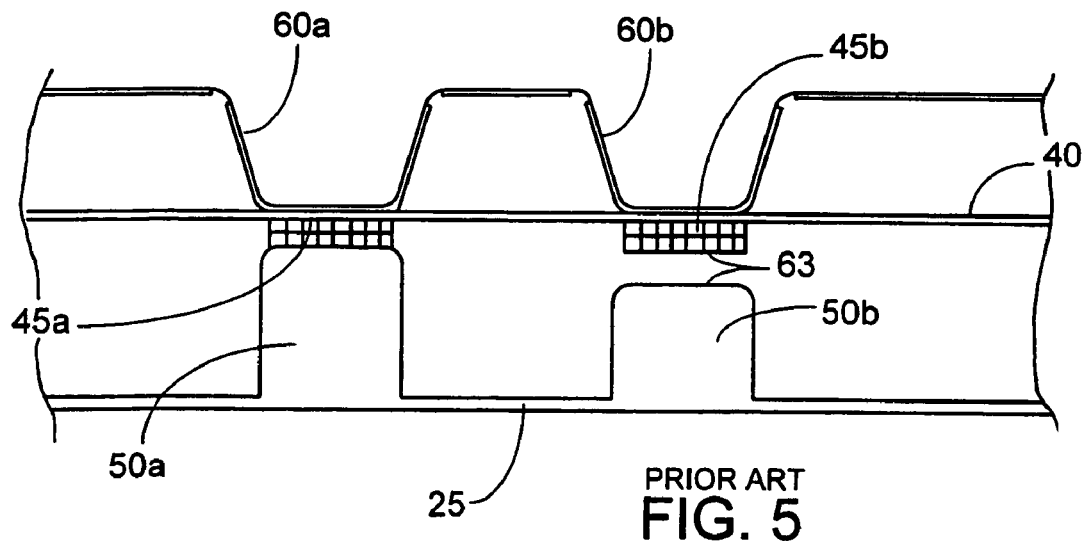
FIG. 5 is a cross-sectional view of the circuit board of FIG. 4 disposed between the housing cover and component pads.

Referring to FIG. 6, the housing cover 75 includes screw holes 80 and projections 90a, 90b, 90c and 90d extending from slotted tabs 95a, 95b, 95c and 95d. The cover can also include ventilation holes 85. The tabs 95 can be attached along a peripheral edge of the cover and separated from the cover along the remaining sides by slots 100a, 100b, 100c and 100d, which can be U-shaped, for example. This configuration permits a given projection 90 to deflect substantially independently of the other projections and to promote thermal contact of each component pad with the corresponding electrical component. If the housing cover 85 is formed with a stamping process, the projections 90 and tabs 95 can be formed with a change in stamping tools, requiring no extraneous components.

Figure 7:
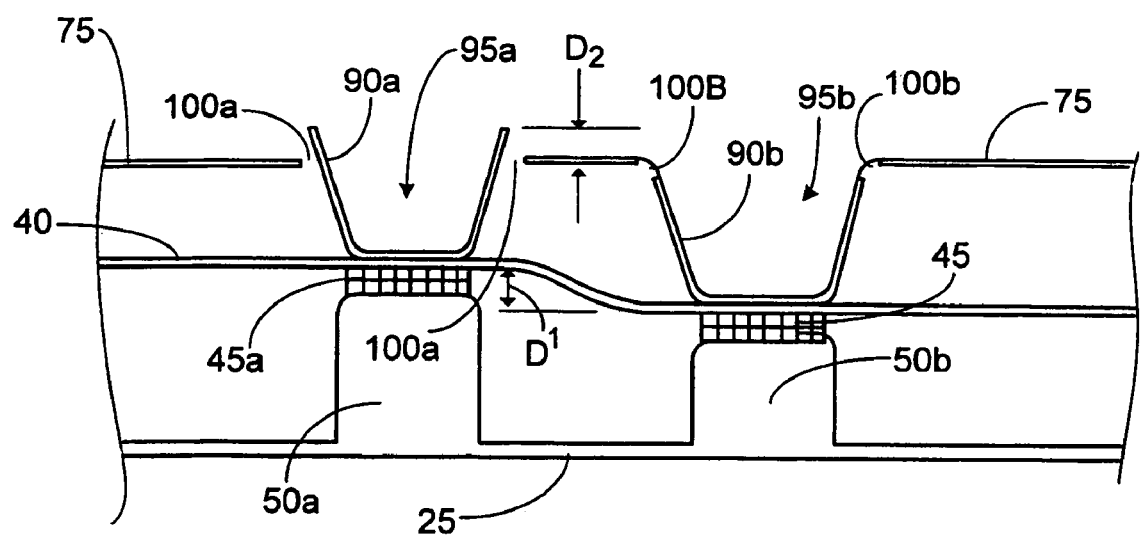
FIG. 7 is a cross-section view taken along line A–A' of FIG. 6 showing adjacent projections engaging adjacent electronic components.

Referring to FIG. 7, it is shown that the combined height of the component pad 50a and electronic component 45a is greater than the combined height of the component pad 50b and electronic component 45b by a distance defined by $D_1$. When the housing cover 75 is applied to the circuit board 40, the height differential $D_1$ between the electronic components is accommodated by permitting a vertical displacement of the projection 90a relative to the vertical displacement of the housing cover 75. In one example, the projections 90a and 90b are substantially decoupled from the housing cover 75 and from each other. When the downward vertical travel of projection 90a is stopped by electronic component 45a contacting component pad 50a, projection 95b continues moving downward until electronic component 90b contacts component pad 50b. Projection 90a is cantilevered at a fixed end and separated from the housing cover 75 along slot 100a. Projection 90b is also cantilevered at a fixed end and separated from the housing cover 75 along slot 10b. Although projections 90a, 90b each extend from a substantially rigid and level housing cover 75, projection 90b can extend farther than projection 90a by a distance given by $D_2$. In one example, the distance $D_2$ is about equal to the distance $D_1$. The distances shown in FIG. 7 are exaggerated for clarity.

In another example, three or more electronic components (not shown) each have different heights and are proximate each other. Projections 90 corresponding to the locations of the electronic components first contact the circuit board and bias the electronic component for contact with corresponding components pads. In one example, the projections are formed having a predetermined amount of resistance to deflection for specific applications, based on the position and proximity of the electronic components requiring direct contact with the heat sink and any associated stack-up tolerances, for example.

Figure 8:
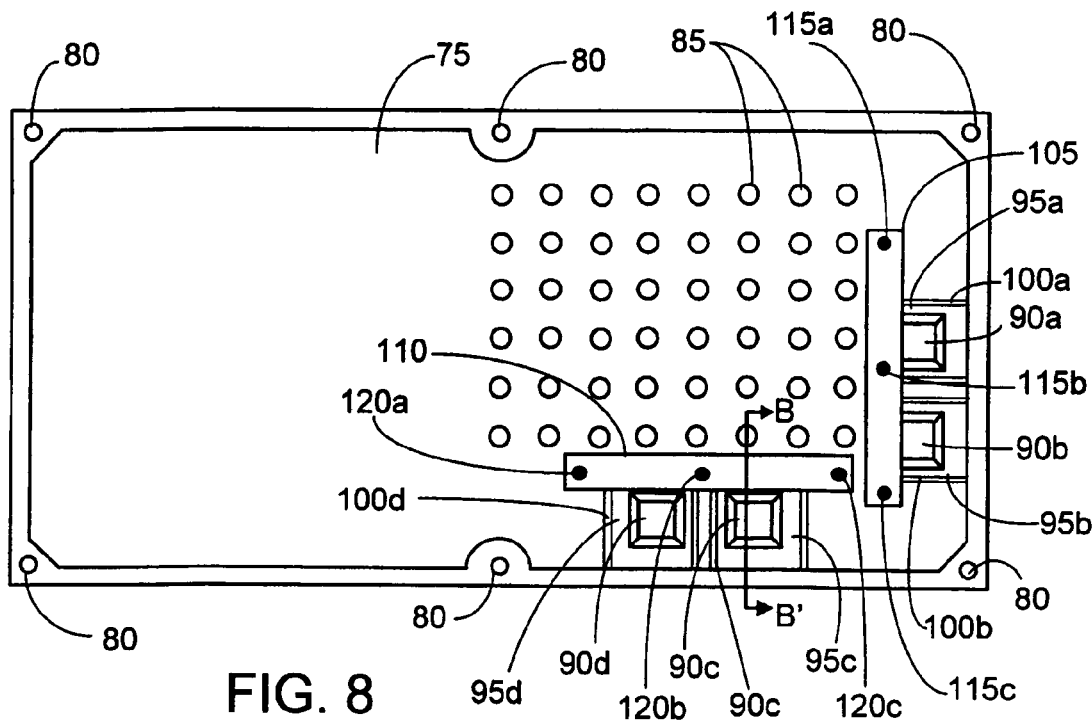
FIG. 8 is a plan view of a housing cover including projections and spanning members.

Referring to FIG. 8, the housing cover 80 can include spanning elements 105 and 110 extending along the free end of adjacent tabs 95a and 95b and adjacent tabs 95c and 95d, respectively. The spanning elements 105 can be attached to the housing cover at connections 115a, 115b and 115c and spanning element 110 can be attached to the housing cover at connections 120a, 120b and 120c. In some examples, elements 105, 110 can be attached by riveting, welding or bonding, for example. In other examples, the elements can be integrally formed with the housing cover. The spanning elements limit the upward deflection of the tabs 95 to a predetermined position.

Figure 9:
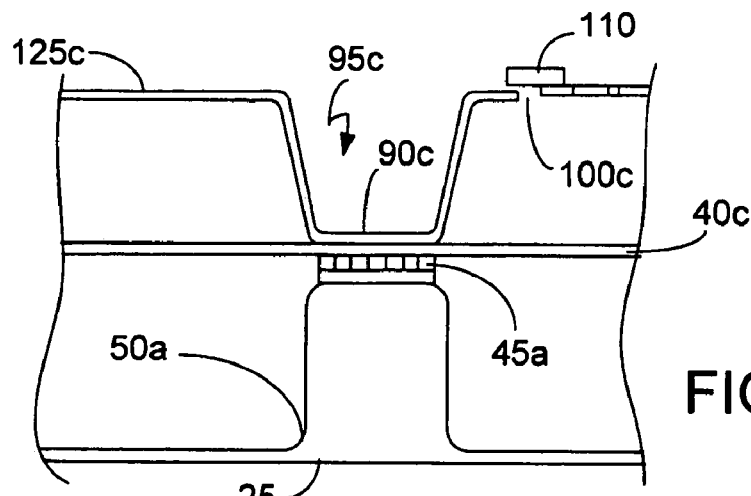
FIG. 9 is a cross-sectional view taken along line B–B' of FIG. 8 showing a tab with projections.

In one example, as shown in FIG. 9, the tab 95c can deflect about a connected edge 125c in the downward direction, but the movement of the tab 95c is constrained in the upward direction by the spanning element 110. As the spanning elements are connected along adjacent tabs, the movement of these tabs is similarly restrained.

Figure 10:
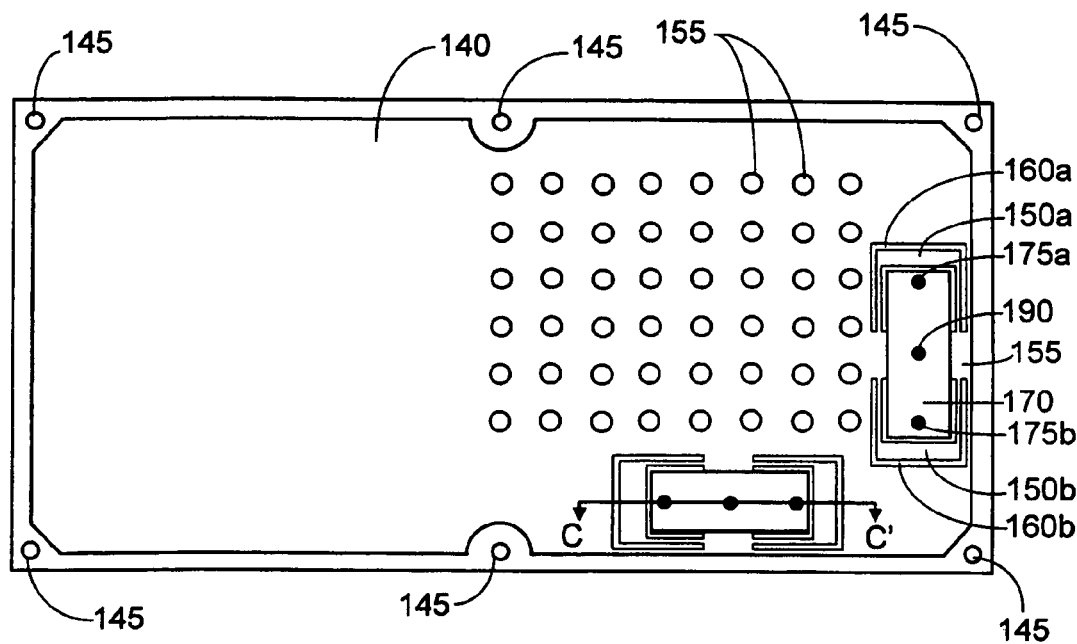
FIG. 10 is a plan view of a housing cover including linkages connecting adjacent projections.

In another example, as shown in FIG. 10, the housing cover 140 has screw holes 145 and slotted tabs 150a, 150b, 150c and 150d. The cover can include ventilation holes 155. Adjacent tabs 150a and 150b are attached to the housing cover along a common shoulder 155 and are separated from the housing cover along the remaining sides by slots 160a and 160b. Adjacent tabs 150c and 150d are attached to the housing cover along a common shoulder 165 and are separated from the housing cover along the remaining sides by slots 160c and 160d. A substantially rigid linkage 170 connects the free edge of tabs 150a and 150b at connection points 175a, 175b, respectively, and linkage 180 connects the free edges of tabs 150c and 150d at connection points 175c, 175d, respectively. The linkages 170, 180 are attached to shoulders 155, 165 at connection points 190 and 195, respectively. In another example, linkages 170, 180 are integrally formed with the housing cover and extend from shoulders 155, 165, respectively.

Figure 11:
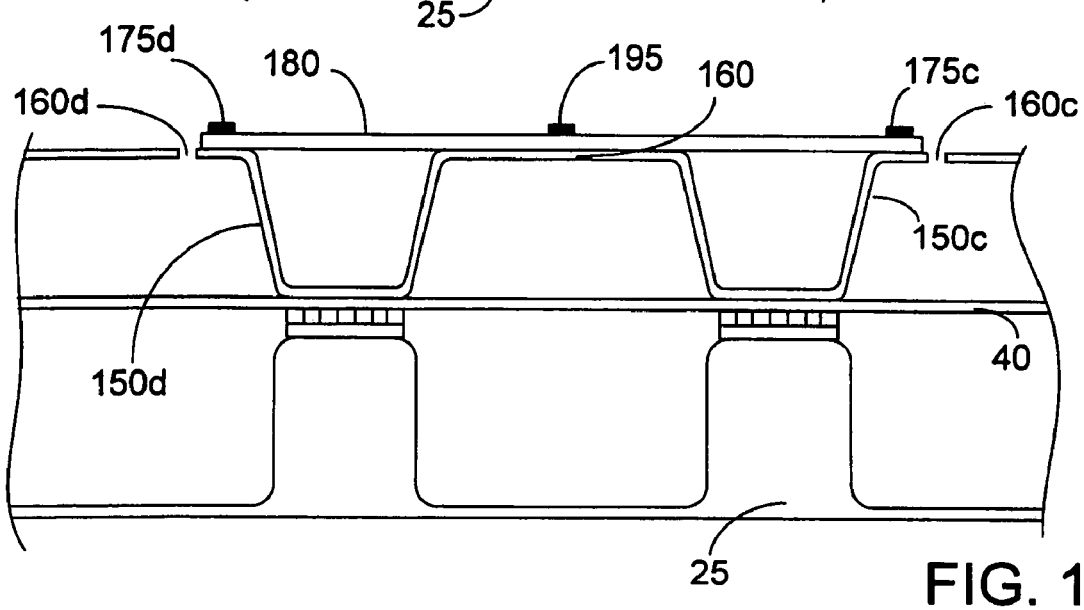
FIG. 11 is a cross-sectional view taken along line C–C' of FIG. 10 showing two adjacent projections connected with a linkage.
Figure 12:
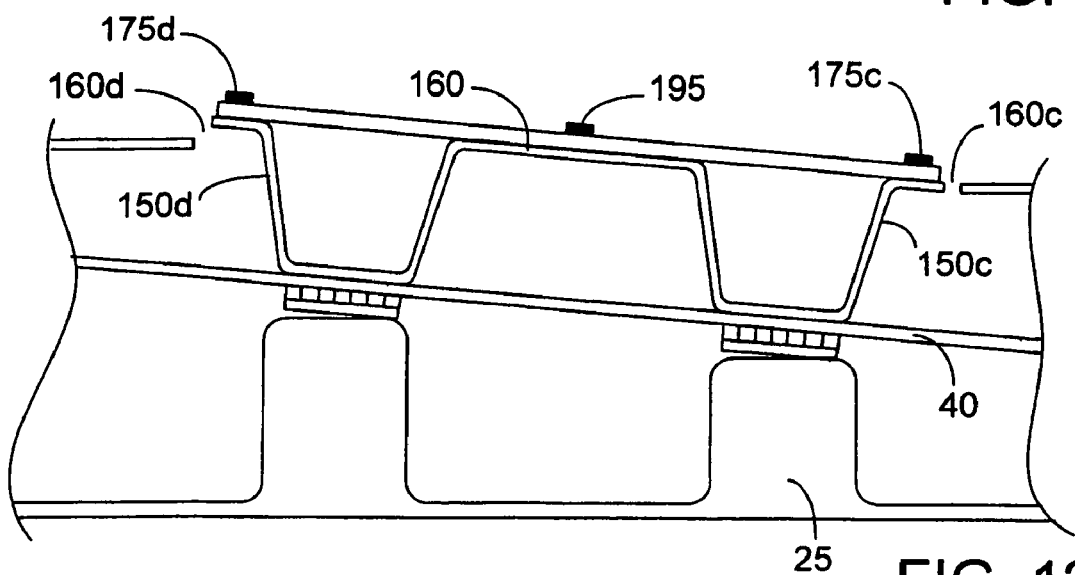
FIG. 12 depicts the adjacent projections of FIG. 11 engaging a circuit board.

As shown in the example of FIGS. 11 and 12, an upward deflection of tab 150d, relative to the cover, results in a downward deflection of adjacent tab 150c, relative to the cover. Tabs 150c and 150d, linkage 180 and the shoulder 160 all collectively rotate about the connection point 195.

Other implementations are within the scope of the following claims.

What is claimed is:

1. An apparatus comprising:
   a housing cover to cause electrical components on a circuit board to engage with at least one component pad of a heat sink, the housing cover being substantially coextensive with the circuit board;
   a first and second projection integrally formed from the housing cover, the projections located on the cover to bias the electrical components against the component pad, the projections proximate each other;
   a mechanism that permits a vertical displacement of the projections relative to the vertical displacement of the housing cover; and
   a spanning member extending over a portion of the first and second projections and coupled with the cover.

2. The apparatus of claim 1 wherein the mechanism further comprises a slot extending around at least part of the projection so as to substantially decouple a vertical displacement of the projection from a vertical displacement of the housing cover.

3. The apparatus of claim 1 in which the mechanism comprises a cantilevered tab extending from a perimeter of the housing cover.

4. The apparatus of claim 1 in which the projections are configured to deflect independently.

5. The apparatus of claim 1, wherein the spanning member extends along the projections to substantially limit the upward vertical displacement of the projections.

6. The apparatus of claim 5 in which the spanning element is integrally formed with the housing cover.

7. The apparatus of claim 5 in which the spanning element is attached to the housing cover by at least one of riveting, welding, and bonding.

8. The apparatus of claim 1, wherein the spanning member is attached to the first projection and the second projection and to an intermediate pivot therebetween.

9. The apparatus of claim 8 in which the spanning lever biases the second projection against the direction of the displacement of the first projection.

10. The apparatus of claim 8 in which a positive vertical displacement of the first projection causes a proportional negative vertical displacement of the second projection.

11. The apparatus of claim 8 in which the spanning lever is integrally formed with the housing cover.

12. The apparatus of claim 8 in which the spanning lever is attached by at least one of riveting, welding, and bonding.

13. The apparatus of claim 1 in which the housing cover is substantially planar.

14. The apparatus of claim 1 wherein the heat sink is configured for an audio amplifier.

15. The apparatus of claim 14 wherein the audio amplifier is adapted for a vehicle sound system.

16. An apparatus comprising:
   a housing cover to cause electrical components to engage with at least one component pad extending from a heat sink;

first and second projections integrally formed from the housing cover, the projections located on the cover to bias the electrical component against at least one component pad;

a mechanism that permits a vertical displacement of the projection relative to the vertical displacement of the housing cover; and a spanning element lever that biases the second projection against the direction of the displacement motion of the first projection.

17. The apparatus of claim 16 wherein the housing cover and heat sink are adapted for an audio amplifier in a vehicle sound system.

18. An audio amplifier configured for use in a vehicle, the amplifier comprising:

a heat sink chassis containing a circuit board and configured for dissipating heat from electrical components positioned on the circuit board to ambient surroundings;

a housing cover fitted to the chassis to cause electrical components positioned on a first side of the circuit board to engage with at least one component pad extending from the heat sink chassis;

a first and second projection integrally formed from the housing cover, the projections located on the cover to bias a second side of the circuit board opposite the first side, to cause electrical components to engage the component pad, the projections proximate each other;

a mechanism that permits a vertical displacement of the projection relative to the vertical displacement of the housing cover; and a spanning member extending over a portion of the first and second projections and coupled with the cover.

19. A housing cover for a heat sink, the housing cover comprising:

a number of projections integrally formed from the cover, the projections located on the cover to cause integrated circuits to engage component pads extending from the heat sink, at least two of the projections being proximate each other and comprising a cantilevered tab extending from a perimeter of the housing cover, the projections being configured to deflect substantially independently;

a slot extending around at least part of the projection so as to substantially decouple a vertical displacement of the projections from a vertical displacement of the housing cover; and a spanning element extending along at least one projection to substantially limit the upward deflection of the projections.

20. A housing cover for a heat sink, the housing cover comprising:

first and second cantilevered projections integrally formed from the cover, the projections located on the cover for biasing integrated circuits against at least one component pad extending from the heat sink;

a slot extending around at least part of the projections so as to substantially decouple a vertical displacement of the projections from a vertical displacement of the housing cover; and a spanning lever attached to the first projection and the second projection and to an intermediate pivot therebetween;

wherein a positive vertical displacement of the first projection causes a proportional negative vertical displacement of the second projection.

21. A method of manufacturing a housing cover for an amplifier, the method comprising:

integrally forming the cover from a unitary work-piece, the cover comprising:

a first and second projection integrally formed from the housing cover, the projections located on the cover to bias the electrical components against the component pad, the projections formed proximate to each other;

a mechanism that permits a vertical displacement of the projection relative to the vertical displacement of the housing cover; and a spanning member formed over a portion of the first and second projections and coupled with the cover.

22. The method of claim 21 wherein the mechanism is formed to include a slot extending around at least part of the projection so as to substantially decouple a vertical displacement of the projection from a vertical displacement of the housing cover.

23. The method of claim 22 wherein the spanning member extends along the projections to substantially limit the upward vertical displacement of the projections.

24. The method of claim 22 wherein the spanning member is attached to the first projection and the second projection and to an intermediate pivot therebetween.

25. A method for engaging electrical components on a circuit board of an audio amplifier with a portion of a heat sink, the method comprising:

providing a unitary housing cover, the cover being substantially coextensive with the circuit board, to permit a vertical displacement of integrally formed projections relative to a vertical displacement of the housing cover;

applying the cover to the amplifier housing; engaging a first electrical component with the component pad by biasing an area on a second side of the circuit board, opposite the first side of the circuit board;

engaging a second electrical component with the component pad by biasing an area on the second side of the circuit board, opposite the position of the second electrical component; and applying a spanning member over a portion of the first and second projections and engaging the cover.

* * * * *